United States Patent

Liu et al.

[11] Patent Number: 5,868,898
[45] Date of Patent: Feb. 9, 1999

[54] FLUID DISPENSING DEVICE FOR WET CHEMICAL PROCESS TANK AND METHOD OF USING

[75] Inventors: Nai Huai Liu; Kuo Liang Lu; B. J. Chang, all of Hsin-Chu, Taiwan

[73] Assignee: Taiwan Semiconductor Manufacturing Company, Ltd., Hsin-Chu, Taiwan

[21] Appl. No.: 752,556

[22] Filed: Nov. 21, 1996

[51] Int. Cl.[6] ................................................ B05C 1/00
[52] U.S. Cl. .................. 156/345; 134/100.1; 134/902; 222/195; 239/418; 239/566; 216/92; 438/748
[58] Field of Search .................... 156/345 L; 216/90, 216/92; 438/747, 748; 239/143, 548, 550, 566, 398, 418; 134/902, 100.1; 222/195

[56] References Cited

U.S. PATENT DOCUMENTS

| 1,016,487 | 2/1912 | Freer ........................................... 216/92 |
| 1,923,654 | 8/1933 | Andreasen ................................ 299/89 |
| 2,383,946 | 9/1945 | Tietig ............................................ 23/1 |
| 3,306,792 | 2/1967 | Thurmel et al. ..................... 156/345 L |
| 3,745,079 | 7/1973 | Cowles et al. ....................... 156/345 L |
| 4,251,317 | 2/1981 | Foote ..................................... 156/345 L |
| 4,840,701 | 6/1989 | Stern ....................................... 156/637 |
| 5,082,518 | 1/1992 | Molinaro .............................. 156/345 L |
| 5,346,101 | 9/1994 | Hargis et al. ........................... 222/195 |
| 5,464,480 | 11/1995 | Matthews ................................ 134/1.3 |
| 5,474,616 | 12/1995 | Hayami et al. ........................... 134/32 |
| 5,520,205 | 5/1996 | Guldi et al. ............................ 134/98.1 |
| 5,676,281 | 10/1997 | Reier ..................................... 222/195 |
| 5,704,981 | 1/1998 | Kawakami et al. .................... 156/345 |

FOREIGN PATENT DOCUMENTS

| 63-86525A | 4/1988 | Japan ................................. 156/345 L |
| 4-162723A | 6/1992 | Japan ................................. 156/345 L |
| 5-121392 | 5/1993 | Japan ................................. 156/345 L |
| 117897 | 8/1958 | U.S.S.R. ............................. 156/345 L |
| 910009 | 11/1962 | United Kingdom ............... 156/345 L |

*Primary Examiner*—R. Bruce Breneman
*Assistant Examiner*—Anita Alanko
*Attorney, Agent, or Firm*—Tung & Associates

[57] ABSTRACT

A wet chemical process tank for processing semiconductor wafers equipped with a specially designed fluid dispenser positioned at the bottom of the tank where the dispenser has a fluid dispensing member having an elongated body connected on at least one end to at least one support member for stabilizing the member and a fluid passage therein in fluid communication with a plurality of openings provided on at least one of the vertical sides of the member such that a fluid may only exit the member in a horizontal direction so that bubbles generated do not directly contact the semiconductor wafers suspended at the center of the tank.

15 Claims, 1 Drawing Sheet

FLUID DISPENSING DEVICE FOR WET CHEMICAL PROCESS TANK AND METHOD OF USING

FIELD OF THE INVENTION

The present invention generally relates to a wet chemical tank for processing semiconductor wafers and more particularly, to a wet chemical tank for processing semiconductor wafers that utilizes a fluid dispenser of generally a rectangular cross-sectional shape equipped with at least one support member for stabilizing the dispenser and a plurality of openings on each vertical side of the dispenser such that fluid may only exit the dispenser in a horizontal direction.

BACKGROUND OF THE INVENTION

In semiconductor fabrication process, various techniques of etching resist-imaged photomasks, silicon wafers or other semiconductor materials have been used. A wet etching technique conducted in an immersion tank is generally a practical high-throughput, flexible fabrication process. By properly selecting etchant chemicals, etch reactions with a target film are thermodynamically favored over reactions with other films. Desirable etch-rate ratios can be usually obtained.

A wet etching method is especially suitable for the blanket etching of materials such as polysilicon, oxide, nitride and metal. The method is capable of providing a desirable etch selectivity, a damage-free interface and particle-contamination-free wafers. In the more recently developed wet etching technology, automated robotic handling systems and ultra-pure chemicals are used to further improve particle control and process consistency. A well-controlled wet etching technique is therefore the choice of etching process in VLSI and ULSI fabrication techniques.

One of the key criteria in carrying out a wet etching process is that the etch products must be soluble in the etchant solution and therefore, no contaminating particles are generated. In an immersion etching process, the volume of the etching tank should be large enough to create enough pressure on the wafer surface in order to ensure an accurate balance of the etchant components; to keep the concentration of the etchant relatively constant; and to minimize the number of times the etchant tank must be changed. An etchant bath change creates expensive down time, and furthermore, the handling of highly hazardous corrosive materials creates potential safety problems.

Wet etching is a frequently used technique for stripping photoresist films from silicon wafers where the complete removal of resist images without adversely affecting the wafer surface is desired. The resist layer or images should be completely removed without leaving any residues, including contaminant particles that may have been present in the resist. The underlying surface of the photoresist layer should not be adversely affected, for instance, accidental etching of the metal or oxide surface should be avoided. Liquid etchant strippers should produce a reasonable bath yield in order to prevent redeposition of dissolved resist on the wafers. The etchant should completely dissolve the photoresist layer in a chemical reaction, and not just lifting or peeling so as to prevent redeposition. It is also desirable that the etching or stripping time be reasonably short in order to permit high wafer throughput.

Wet etchants such as sulfuric acid ($H_2SO_4$) and mixtures of $H_2SO_4$ with other oxidizing agents such as hydrogen peroxide ($H_2O_2$) are widely used in stripping photoresist or in cleaning a wafer surface after the photoresist has been stripped by other means. For instance, a frequently used mixture is seven parts $H_2SO_4$ to three parts 30% $H_2O_2$, or a mixture of 88% sulfuric acid and 12% nitric acid. Wafers to be stripped can be immersed in the mixture at a temperature between about 100° C. and about 150° C. for 5~10 minutes and then subjected to a thorough rinse of deionized water and dried in dry nitrogen. This type of inorganic resist strippers, such as the sulfuric acid mixtures, is very effective in the residual-free removal of highly postbaked resist. They are more effective than organic strippers and the longer the immersion time, the cleaner and more residue-free wafer surface can be obtained.

In a typical wet chemical process tank, in order to ensure a perfect mix of acid and other components or a good uniformity in the acid itself, constant stirring or agitation of the solution in the tank is desired. While mechanical stirring or agitation techniques have been used, the moving components of a stirrer or agitator frequently generate contaminant particles that are detrimental to the wafer surfaces. Furthermore, a mechanical stirrer or agitating device tends to work only in a localized area of a large chemical tank while leaving a large area of the tank unmixed. Since wafers are usually loaded into a wafer boat and positioned at or near the center of the tank, too vigorous stirring or agitation of the liquid in the tank may cause the wafers in the wafer boat to move and as a result, stick to each other. Such wafer sticking problems result in uneven and unsatisfactory etching on the wafer surfaces.

An improved mixing method for liquids in a wet chemical tank is to force a fluid to enter the wet chemical tank at the bottom of the tank and then forming gas bubbles to rise from the bottom to the top of the tank and thereby carrying out mixing function along the way. The fluid used is normally a substance that readily reacts with the liquid in the tank such that either a gas or a vapor is generated to form the bubbles. One of such suitable chemical reactions occurring between a liquid in a tank and a fluid pumped therein is an acid and water. For instance, when phosphoric acid ($H_3PO_4$) and ionized water are mixed in a tank, water reacts with the strong acid violently and immediately boils to form water vapor in bubbles and then the bubbles rise to the top of the liquid surface in the tank. During the process where the bubbles rise to the top of the liquid surface, the bubbles cause disturbance in the liquid and thus improve its uniformity by the agitation occurring in the liquid. A conventional system of a wet chemical process tank equipped with a fluid dispensing member, which is commonly called a spray bar, positioned at the bottom of the tank is shown in FIG. 1.

FIG. 1 shows a wet chemical process system 10 including a process tank 12 formed by a bottom wall 14 and four sidewalls 16 which are joined perpendicular to the bottom wall 14 forming a fluid-tight enclosure. The bottom wall 14 and the sidewalls 16 can be constructed of a corrosion-resistant material such as panels of stainless steel or steel panels coated with a corrosion resistant material such as Teflon. Due to the extreme corrosive nature of the processing liquids that are normally used in the wet chemical processing of semiconductor wafers, a securely sealed enclosure is a critical requirement for both maintenance and safety. The size of the tank 12 should be sufficiently large such that, for instance, two wafer boats (not shown) which are capable of holding twenty-four wafers each can be placed in the center of the tank while leaving an adequate space between the wafers and the walls such that a constant movement in the processing liquid can be achieved. Into the wet chemical process tank 12, a fluid dispensing member, or a spray bar, 22 is positioned at the bottom of the tank. A plurality of openings 24 are formed in the top surface 26 of the dispensing member 22 for allowing a fluid to enter the tank.

An enlarged, cross-sectional view of the dispensing member 22 taken at an opening 24 is shown in FIG. 1A. An internal fluid passage 28 is provided in dispensing member 22 which is in fluid communication with conduit 32 through a connector 34 and an elbow section 36 in the dispensing members 22. A precision volumetric pump 42 is used to pump a fluid such as deionized water from an inlet 44 through conduit 32 into the fluid passage 28. Since the volume of the deionized water that enters the process tank for reaction with phosphoric acid must be precisely controlled such that just the right amount of bubbles are generated, the pump 42 utilized must be a high precision volumetric pump that is capable of precisely controlling the amount of liquid pumped therethrough. For instance, into a normal wet chemical process tank of 20-liter capacity that is filled with phosphoric acid, only 40 cubic centimeter of deionized water should be pumped into the tank per minute. At such precisely controlled flow rate, just the right amount of water vapor in bubbles can be generated to suitably mixing the phosphoric acid contained in tank 12.

The fluid dispensing member 22, due to its extended exposure to strong acids when immersed in a tank, must be made of a corrosion-resistant material. A suitable material is Teflon which can be easily machined to provide the internal fluid passage 28 and the openings 24. The connector 34 and the conduit 32 should also be made by a corrosion-resistant material due to their prolonged exposure to corrosive liquids.

In a conventional wet chemical process tank, the fluid dispensing member, as shown in FIG. 1, has fluid outlets facing upward for easier exit of the fluid. Since wafer boats are normally positioned at the center of the tank and therefore, directly above the fluid dispensing member and are in the path of the bubbles formed by water vapor exiting the openings in the dispensing member. This can cause various processing problems. For instance, the bubbles can sometimes stick to a wafer surface such that the specific surface area can not be wetted by the etchant. This can lead to uneven etching of a wafer surface. The rising bubbles can also cause disturbance or movement of the wafers and thus causing the wafers to stick to each other. When the wafer sticking problem occurs, the wafer surfaces which are stuck together are not exposed to etchant solution and thus, poor etching occurs on the surfaces as a result. Furthermore, when the wafers are stuck together due to excessive disturbance from the rising bubbles, the temperature of the etchant liquid in the area immediate adjacent to the stuck wafers differs from the rest of the tank which also causes uneven etching at such local areas. This further creates non-uniformity of etching on the wafer surfaces.

It is therefore an object of the present invention to provide a wet chemical process tank for processing semiconductor wafers that does not have the drawbacks or shortcomings of a conventional wet chemical process tank.

It is another object of the present invention to provide a wet chemical process tank for processing semiconductor wafers that does not cause uneven etching of the wafers and requires only minor modifications in the equipment.

It is a further object of the present invention to provide a wet chemical process tank for processing semiconductor wafers that does not cause non-uniform etching of the wafers by preventing bubbles from a fluid dispensing member positioned at the bottom of the tank from directly contacting the wafers.

It is another further object of the present invention to provide a wet chemical process tank for processing semiconductor wafers equipped with a fluid dispensing member positioned at the bottom of the tank which allows a fluid to be dispensed only from one or both sides of the member such that bubbles formed do not contact the wafers directly.

It is yet another object of the present invention to provide a wet chemical process tank for processing semiconductor wafers that is equipped with a fluid dispensing member positioned at the bottom of the tank which dispenses bubbles from the vertical sides of the member to achieve uniform mixing of a liquid etchant while not directly disturbing the wafers.

It is still another object of the present invention to provide a fluid dispenser for use in a wet chemical process tank that is equipped with a fluid dispensing member having an elongated body, a generally rectangular shaped cross-section and a fluid passage contained therein in fluid communication with a plurality of openings provided on the two vertical sides of the elongated body.

It is another further object of the present invention to provide a fluid dispenser for use in a wet chemical process tank that is equipped with at least one support member of elongated shape connected to at least one end of a fluid dispensing member to support and stabilize the member when fluid is pumped through a fluid passage and a plurality of openings to enter the tank.

It is still another further object of the present invention to provide a method of treating semiconductor wafers in a wet chemical process tank by providing a fluid dispenser for positioning at the bottom of the tank which has an elongated body containing a fluid passage therein in fluid communication with a number of openings provided in at least one vertical side of the elongated body such that fluid may only enter the tank in a horizontal direction.

SUMMARY OF THE INVENTION

The present invention provides a wet chemical process tank for processing semiconductor wafers that is equipped with a specially designed fluid dispensing member for use at the bottom of the tank such that liquid etchant in the tank can be thoroughly mixed without causing wafer sticking problems or non-uniform etching of the wafers.

In a preferred embodiment, a wet chemical process tank for processing semiconductor wafers is provided which is equipped with a tank that has a horizontal bottom wall and four sidewalls perpendicularly joined to the bottom wall forming a fluid-tight enclosure for holding a liquid, a fluid dispenser positioned on and supported by the bottom wall of the tank which has a fluid dispensing member generally of an elongated body connected at least on one end by at least one support member for stabilizing the dispensing member, the dispensing member has a fluid passage therein in fluid communication with a plurality of openings provided on at least one vertical side of the member such that fluid may only exit the member in a horizontal direction, and a conduit member for providing a fluid to the fluid passage in the dispensing member.

In an alternate embodiment, a fluid dispenser for use in a wet chemical process tank is provided which includes a fluid dispensing member that has an elongated body of a generally rectangular shaped cross-section and a fluid passage contained therein in fluid communication with a plurality of openings provided on at least one of the two vertical sides of the elongated body, and at least one support member of elongated shape connected on at least one end to the fluid dispensing member to support and stabilize the dispensing member when fluid is pumped through the fluid passage and the openings.

The present invention is further directed to a method of treating semiconductor wafers in a wet chemical process tank which includes the steps of first providing a tank that has a fluid-tight enclosure and then filling the tank with a processing liquid, providing a fluid dispenser for positioning at a bottom surface of the tank, the dispenser has a main elongated body containing a fluid passage therein in fluid communication with a plurality of openings in at least one vertical side of the elongated body such that fluid may only enter the tank in a horizontal direction, providing a conduit for connecting to and in fluid communication with the fluid passage in the fluid dispenser, and flowing a liquid through the conduit, the fluid passage and the plurality of openings into the tanks in such a way that a reaction product generated between the fluid and the liquid in the tank rises to the top surface of the liquid while substantially not touching the semiconductor wafers suspended in the tank.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention discloses a wet chemical process tank for processing semiconductor wafers that is equipped with a fluid dispenser for dispensing a fluid from openings provided in the sides of the dispenser such that fluid can only exit the member in a horizontal direction so as not to directly interact with semiconductor wafers suspended in the tank.

Figure 1:
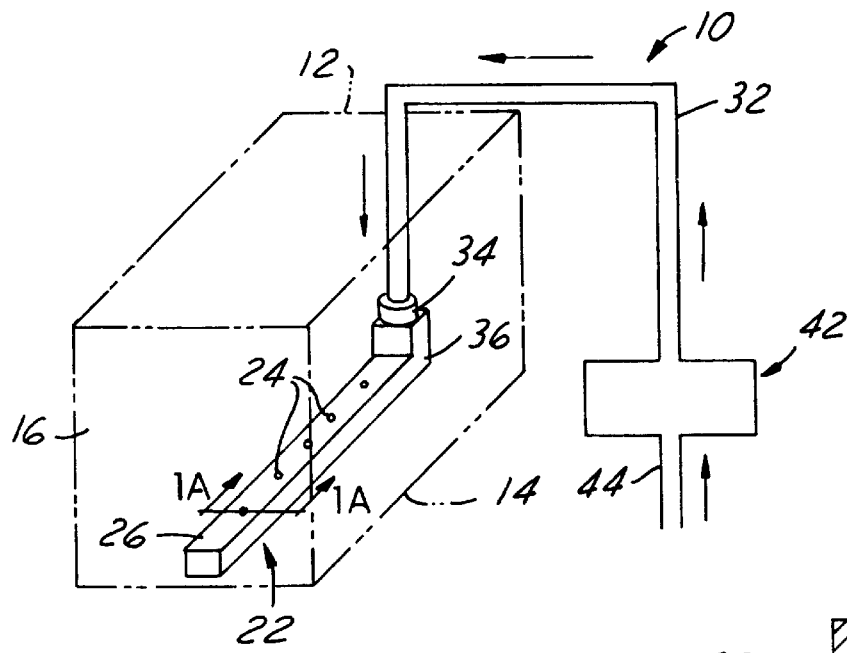
FIG. 1 is a schematic showing a conventional wet chemical process tank equipped with a conventional fluid dispensing member.
Figure 1A:
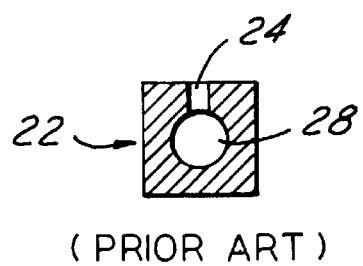
FIG. 1A is an enlarged, cross-sectional view of the fluid dispensing member shown in FIG. 1.
Figure 2:
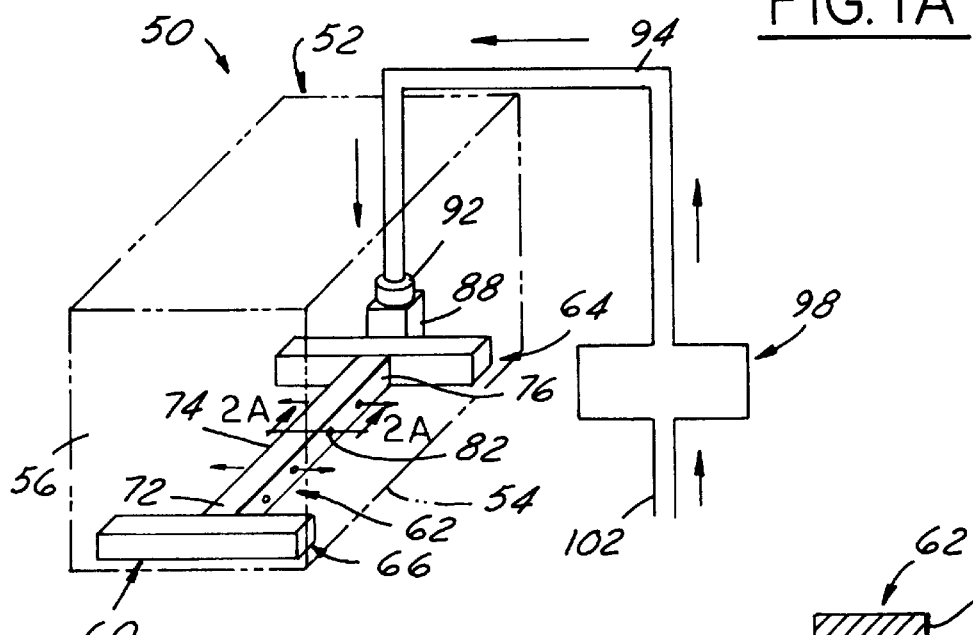
FIG. 2 is a schematic showing the present invention wet chemical process tank equipped with the present invention fluid dispensing member.

Referring initially to FIG. 2, where a present invention wet chemical treatment system 50 is shown. In system 50, a wet chemical process tank 52 which is a preferred embodiment of the present invention is provided. The tank 52 is constructed by a bottom wall 54 and four sidewalls 56 perpendicularly joined to the bottom wall 54 forming a fluid-tight enclosure for containing a liquid. At the bottom of tank 52, a fluid dispenser 60 of the present invention is positioned. The fluid dispenser 60 is constructed of a fluid dispensing member 62 and support members 64 and 66. The novel features of the present invention fluid dispenser 60 can be seen in FIG. 2 as follows, the dispensing member 62 has a top surface 72 and two vertical side surfaces 74 and 76 exposed to the liquid etchant contained (not shown) in process tank 52. The semiconductor wafers to be processed are normally suspended (not shown) in two wafer boats where each holds 24 wafers. The process tank 52 has a dimension such that even when the larger 8-inch wafers are processed, there is sufficient space left between the wafer and the sidewall 56 of the tank to allow adequate movement and therefore uniform concentration of the liquid etchant.

Figure 2A:
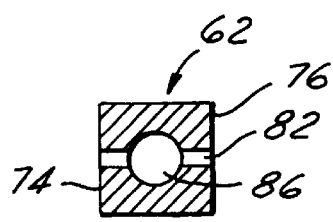
FIG. 2A is an enlarged, cross-sectional view of the fluid dispensing member shown in FIG. 2.

An enlarged, cross-sectional view of the fluid dispensing member 62 is shown in FIG. 2A. In FIG. 2A, the fluid dispensing member 62 has a plurality of openings 82 drilled, or otherwise provided on the vertical side 76 and 74 while the top surface 72 has no openings. The location and size of openings 82 on the dispensing member 62 can be suitably selected such that a suitable distance between the openings are maintained. The dimension of the openings 82 can be selected to suit each particular process such that adequate mixing of the liquid etchant can be achieved. A suitable size for the openings 82 is in the range between about 0.1 mm and about 5 mm. It has been noted that in order to form bubbles from water vapor, the size of the openings should be carefully selected such that bubbles of suitable dimensions are generated at a desirable rate to agitate the liquid etchant and to maintain an uniform concentration in the etchant.

Another important aspect of the present invention is the use of support members 60 and 62 to support and stabilize the fluid dispensing member 62. As shown in FIG. 2, at least one support member can be desirably attached to the end of the fluid dispensing member 62 such that the dispensing member can rest securely on the bottom of tank 52. It is preferred that the support member 60 or 64 has a length approximate that of the inside width of the tank such that the dispensing member 62 can be easily positioned and centered. Two support members 60 and 64 are used in the tank of FIG. 2 to stabilize both ends of the dispensing members 62, even though one may be adequate. The support member stabilizes the dispensing member during operation when fluid such as ionized water is pumped through the fluid passage 86 (shown in FIG. 2A) and the openings 82.

In operation, the present invention fluid dispensing member 62 allows a fluid such as deionized water to exit openings 82 such that water and acid (e.g., $H_3PO_4$) reacts violently to generate bubbles of water vapor by the boiling of water. Since water only exits from the vertical sides of the dispensing member 62, i.e., from sides 74 and 76, bubbles generated rises on both sides of the tank around the outer periphery of and not touching the wafers (not shown) immersed in tank 52. Any direct contact of bubbles with wafers is therefore avoided and the drawbacks caused otherwise by a conventional spray bar arrangement at the bottom of the tank are eliminated.

The fluid pumped through the fluid passage 86 is fed through an elbow portion 88, a connector 92 and conduit 94 as shown in FIG. 2. The amount of deionized water fed into the tank is precisely controlled by a precision volumetric pump 98 where water enters the pump at inlet 102. An accurate control of the amount of water entering into the tank is important since it dictates the number of bubbles generated and the disturbance in the liquid etchant achieved.

It should be noted that while a liquid etchant of phosphoric acid mixed with deionized water is illustrated in the preferred embodiment of the present invention, any other acid may be suitably used in the present invention apparatus. For instance, when a sulfuric acid is used in the tank, hydrogen peroxide can be suitably pumped through the fluid dispensing member to generate bubbles to enhance the mixing and uniformity of sulfuric acid.

In an alternate embodiment of the present invention, a fluid dispensing member 62 as shown in FIG. 2 and 2A is provided which can be advantageously utilized in any net chemical process tanks. The fluid dispensing member allows a fluid to exit through the sides of the member only and thus avoid causing disturbance directly above the dispensing member in the liquid contained in the tank.

While the present invention has been described in an illustrative manner, it should be understood that the terminology used is intended to be in a nature of words of description rather than of limitation.

Furthermore, while the present invention has been described in terms of a preferred and an alternate embodiments, it is to be appreciated that those skilled in the art will readily apply these teachings to other possible variations of the inventions.

The embodiment of the invention in which an exclusive property or privilege is claimed are defined as follows:

1. A wet chemical process tank for processing semiconductor wafers comprising:

a tank having a bottom wall and four sidewalls perpendicularly joined to said bottom wall forming a fluid-tight container for holding a first liquid, a liquid dispenser positioned on and supported by said bottom wall of the tank, said liquid dispenser having a liquid dispensing member of an elongated body and generally a rectangular shaped cross-section connected on at least one end to at least one support member for stabilizing said dispensing member, said dispensing member having a liquid passage therein in fluid communication with a plurality of openings provided on at least one vertical side of the member such that a second liquid may only exit the member in a horizontal direction, said second liquid being different than said first liquid, and a conduit member for providing said second liquid to said liquid passage in said dispensing member.

2. A wet chemical process tank according to claim 1, wherein said tank is a wet etcher.

3. A wet chemical process tank according to claim 1, wherein said bottom wall and sidewalls of the tank further comprising a corrosion-resistant surface.

4. A wet chemical process tank according to claim 1, wherein said fluid dispenser is made of a corrosion-resistant material.

5. A wet chemical process tank according to claim 1, wherein said fluid dispensing member and said support members are made of Teflon.

6. A wet chemical process tank according to claim 1 further comprising a connector member for connecting between said conduit member and said fluid dispenser.

7. A wet chemical process tank according to claim 1, wherein said plurality of openings in said fluid dispensing member have a diameter of at least 0.1 mm.

8. A wet chemical process tank according to claim 1, wherein said plurality of openings in said fluid dispensing member has a diameter of not more than 5 mm.

9. A wet chemical process tank according to claim 1, wherein said support members having a length sufficient to stabilize said fluid dispensing member without movement when fluid is pumped through said plurality of openings in said fluid dispensing member.

10. A wet chemical process tank according to claim 1, wherein said fluid dispenser is generally of an "I" configuration.

11. A wet chemical process tank according to claim 1, wherein said conduit member is made of a corrosion-resistant material.

12. A wet chemical process tank according to claim 1, wherein said tank is a wet etcher for holding a strong acid.

13. A method for treating semiconductor wafers in a wet chemical process tank comprising the steps of:

providing a tank having a fluid-tight enclosure and filling the tank with a processing liquid, providing a fluid dispenser for positioning at a bottom surface of said tank, said dispenser having an elongated body containing a fluid passage therein in fluid communication with a plurality of openings in at least one vertical side of said elongated body such that fluid may only enter the tank in a horizontal direction, providing a conduit for connecting to and in fluid communication with said fluid passage in said fluid dispenser, and flowing a fluid through said conduit, said fluid passage and said plurality of openings into said tank in such a way that a reaction product generated between said fluid and said liquid in the tank rises to the surface of the liquid without substantially touching the semiconductor wafers suspended in the tank.

14. A method according to claim 13, wherein said reaction production is produced between an acid and wafer.

15. A method according to claim 13, wherein said fluid dispenser further comprises at least one support member connected to at least one end of said fluid dispenser for stabilizing the dispenser when fluid is pumped therethrough.

* * * * *